United States Patent [19]
Jang et al.

[11] Patent Number: 5,357,526
[45] Date of Patent: Oct. 18, 1994

[54] METHOD AND APPARATUS FOR CORRECTING ERRORS OF COMPRESSED DATA

[75] Inventors: Gook H. Jang; Tae S. Yang, both of Seoul, Rep. of Korea

[73] Assignee: Goldstar Co., Ltd., Seoul, Rep. of Korea

[21] Appl. No.: 997,778

[22] Filed: Dec. 28, 1992

[30] Foreign Application Priority Data

Dec. 27, 1991 [KR] Rep. of Korea ............... 24541/1991

[51] Int. Cl.$^5$ ............................................. G06F 11/10
[52] U.S. Cl. .................................. 371/37.4; 371/38.1
[58] Field of Search ................. 371/37.4, 37.5, 38.1, 371/39.1

[56] References Cited

U.S. PATENT DOCUMENTS

4,852,099 7/1989 Ozaki ............................ 371/37.5
4,928,280 5/1990 Nielson et al. ................. 371/37.5 X
5,068,856 11/1991 Nagasawa et al. ............... 371/37.5

Primary Examiner—Joseph Ruggiero
Attorney, Agent, or Firm—Fleisler, Dubb, Meyer & Lovejoy

[57] ABSTRACT

A method for and an apparatus for correcting errors of compressed digital data, using a dual decoding system for correcting errors generated at the data by adding parity bits having an error correction capability for K symbols to the data fields of the data. Errors of up to K are corrected by the $C_1$ field- and $C_2$ field-decodings. After the error correction, a determination is made about the presence of errors in the corrected data so that an erroneous detection and an erroneous correction of errors are prevented, thereby minimizing an influence by an error propagation generated upon the extension of compressed data. The present invention achieves an improvement in error correcting capability for compressed digital image data.

10 Claims, 8 Drawing Sheets

C1-FIELD DECODING (PRIOR ART)

FIG.—1A

C2-FIELD DECODING (PRIOR ART)

METHOD AND APPARATUS FOR CORRECTING ERRORS OF COMPRESSED DATA

BACKGROUND OF THE INVENTION

1. Field of the Invention

The present invention relates to a method and an apparatus for correcting errors of compressed digital data, and more particularly to a method and an apparatus for correcting errors of compressed digital data, capable of minimizing an influence by errors upon expanding the compressed data and achieving an improvement in error correcting capability, in an apparatus for processing the compressed image data.

2. Description of the Prior Art

Figure 1A:
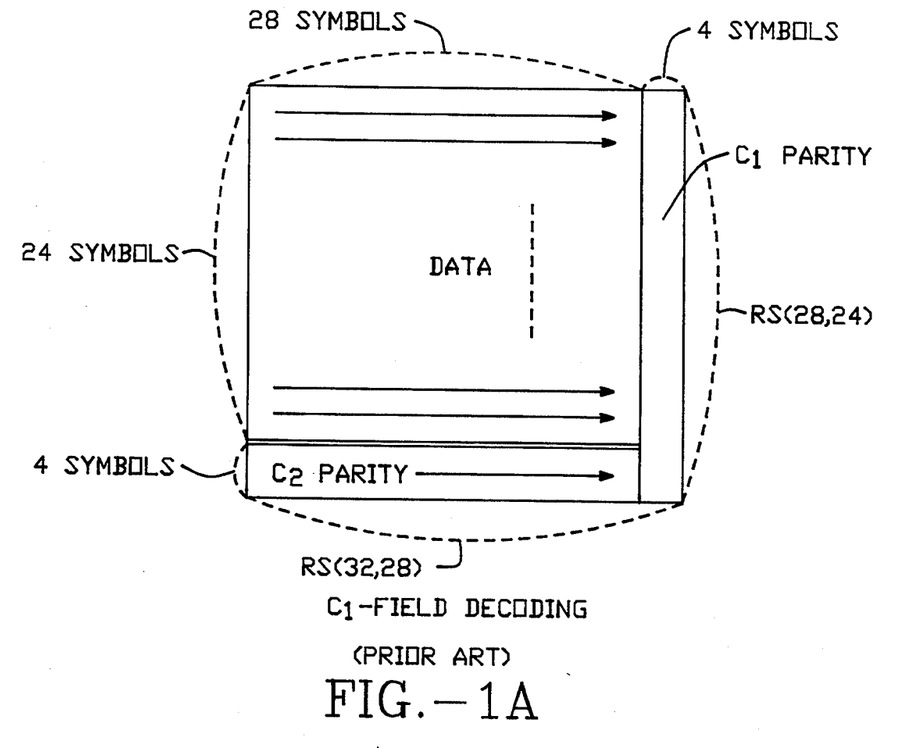
FIG. 1A is a schematic view explaining a $C_1$ field-decoding of a dual decoding system.
Figure 1B:
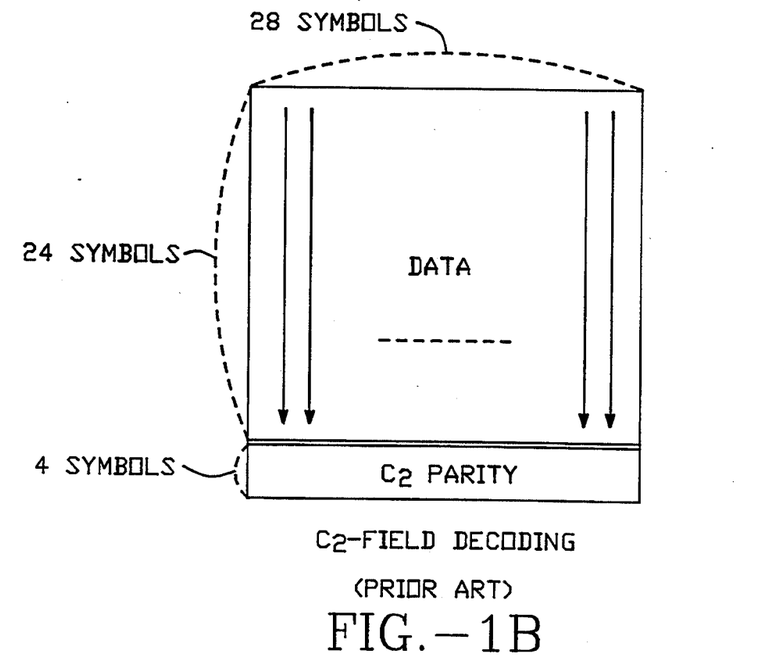
FIG. 1B is a schematic view explaining a $C_2$ field-decoding of a dual decoding system.

Referring to FIGS. 1A and 1B, there is illustrated a general method for dual encoding data. In accordance with the method, first, rows of data are encoded in a vertical direction, for adding a parity bit ($C_2$ encoding), as shown in FIG. 1A. Thereafter, columns of data are encoded in a horizontal direction, for adding a parity bit ($C_1$ encoding). Upon error-decoding the encoded data at a receiving stage, $C_1$ decoding and $C_2$ decoding are carried out in a reverse manner.

Upon the encoding, read solomon (RS) codes on a galois field ($2^8$) are used. The RS codes are proper for an operation by words as a high rate operation, as compared with an operation by bits. In particular, they are proper for a correction by words such as a 8-8 conversion or 8-10 conversion. In addition, a dual coding is carried out for improving the error-correcting capability.

Figure 2:
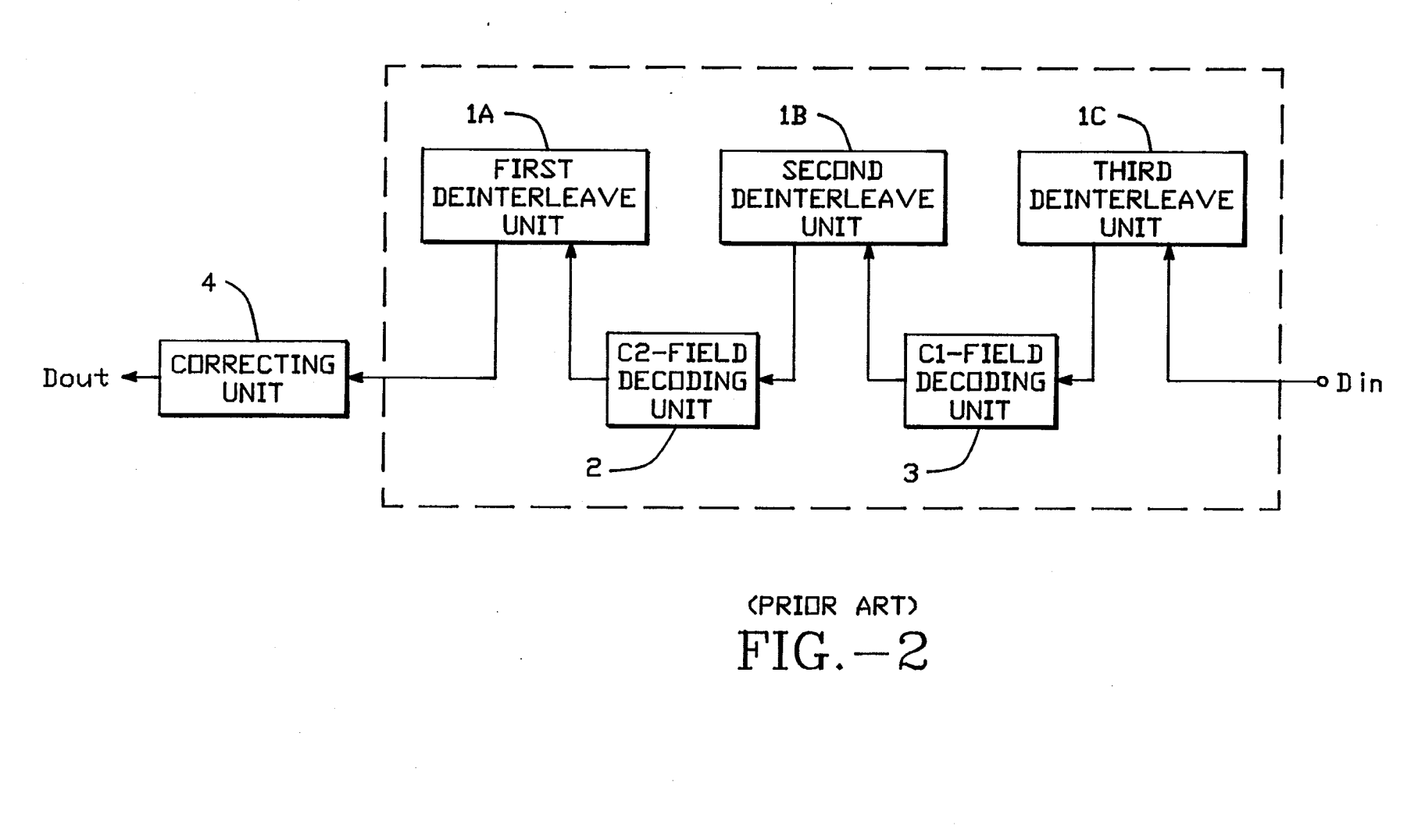
FIG. 2 is a block diagram of a dual decoding and deinterleave system.

A conversion of burst errors into random errors is accomplished according to deinterleave procedures. A general error correction system makes the error correction easy, in that burst errors are converted into random errors through three deinterleave units associated with an error correction unit, as shown in FIG. 2.

A central data processor (CDP) uses cross interleave read-solomon codes (CIRSCs) for the error correction. This error correction system is a kind of dual coding in which RS codes are dually applied to data, so as to provide different combinations for the same data group.

As codes of $C_1$ and $C_2$ fields, RS(32,28) and RS(28,24) on GF($2^8$) are used, respectively.

Because each code of $C_1$ and $C_2$ fields is added with 4 symbol parity bite, it is possible to correct symbol errors of up to two in an error correction and symbol errors of up to four in an erase correction.

Figure 3:
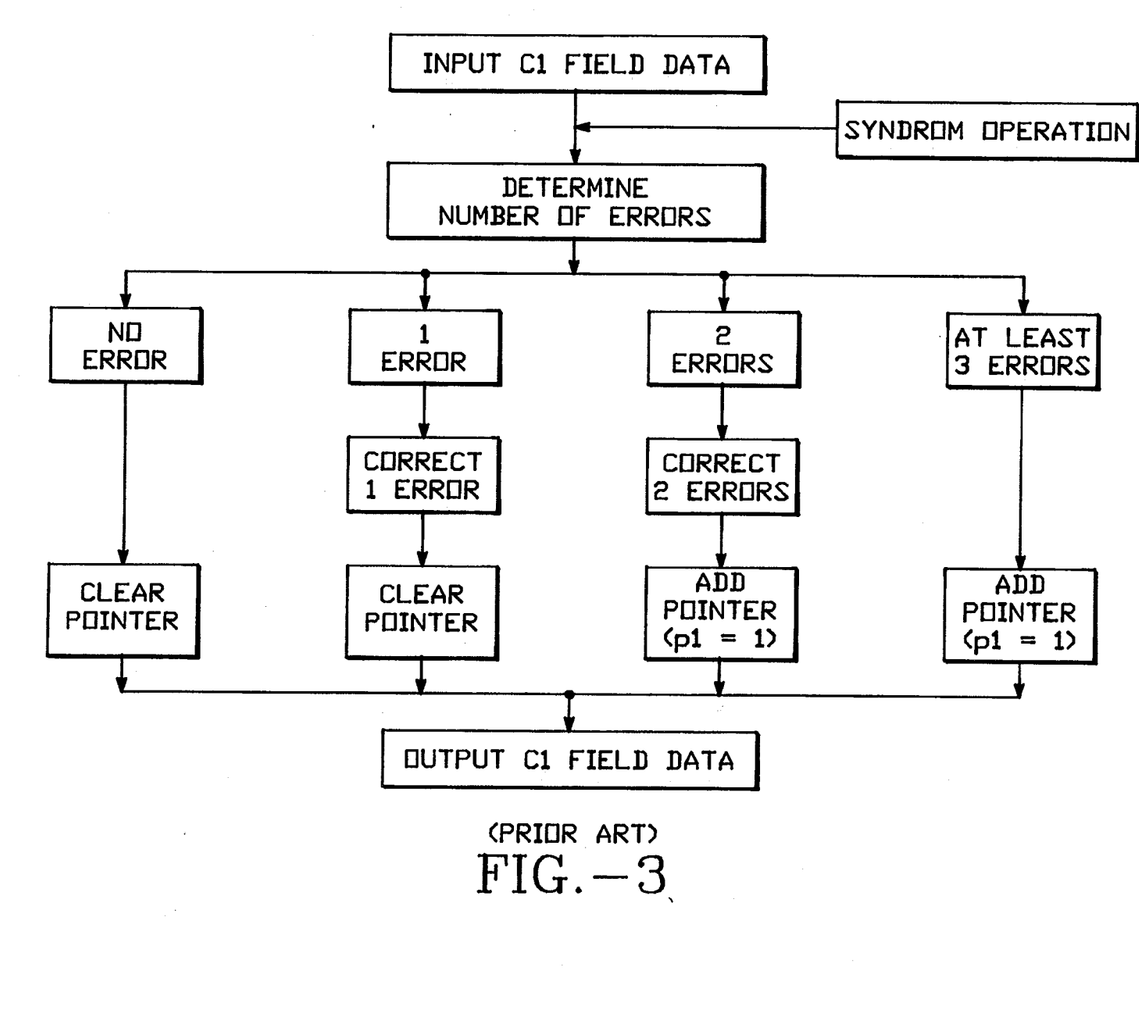
FIG. 3 is a flowchart of signals in $C_1$ field-decoding procedures carried out in a CDP.

FIG. 3 is a flowchart illustrating a $C_1$ field-decoding system in a general CDP.

As data of $C_1$ field is inputted as shown in FIG. 3, the number of errors is checked according to a syndrome operation. Depending on the number of errors, the following operations are carried out.

(1) No Error: Data is outputted without any error correction, but with a pointer being cleared.

(2) 1 Symbol Errors: Data is outputted after correcting one symbol error and clearing a pointer.

(3) 2 Symbol Errors: Data is outputted after correcting two symbol errors and adding a pointer to each data column. The addition is for avoiding an erroneous correction.

(4) At least 3 Symbol Errors: Data is outputted without any error correction, but with an addition of a pointer to each corresponding data column. This is because the three symbol correction is beyond the error correction capability.

Figure 4:
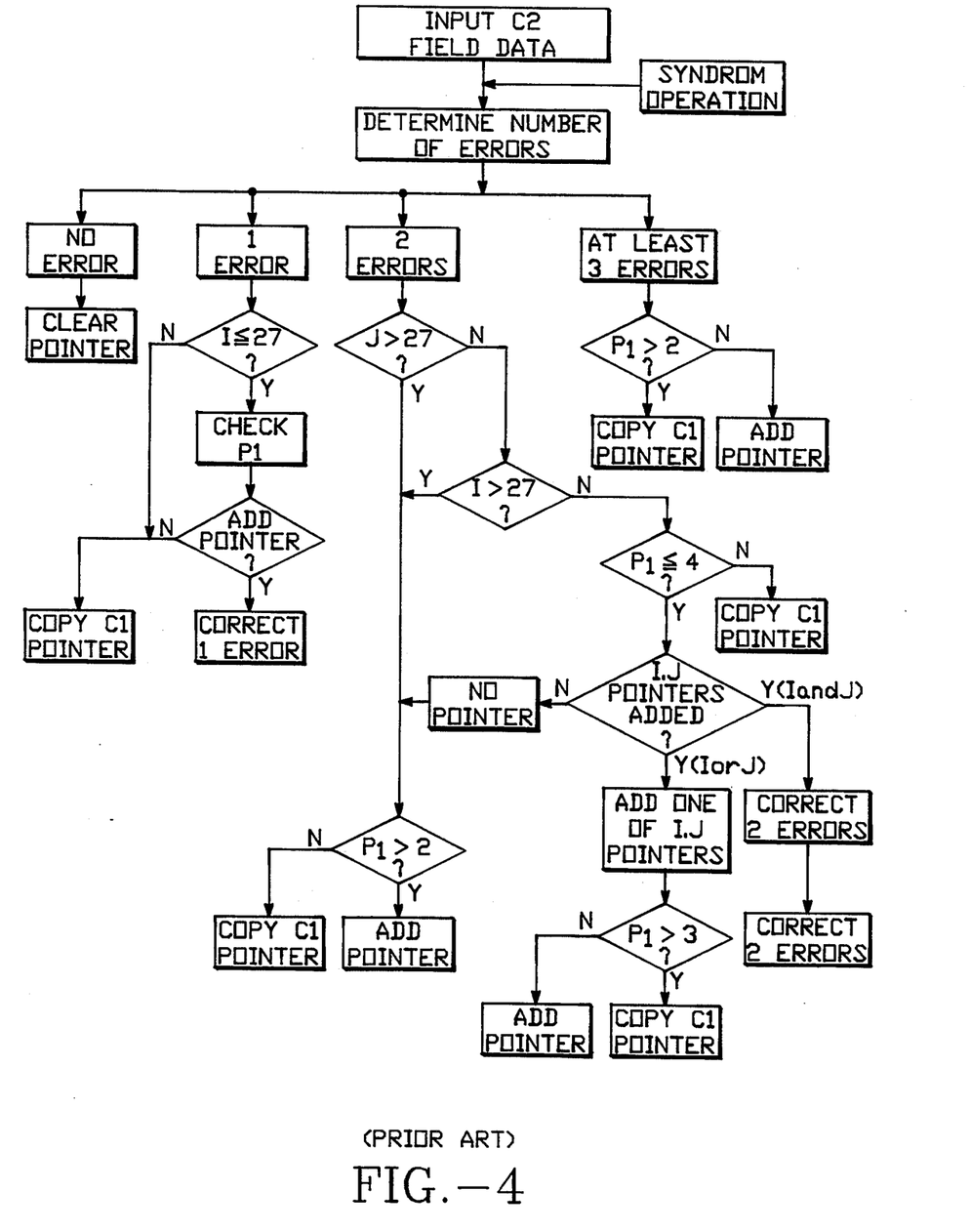
FIG. 4 is a flowchart of signals in $C_2$ field-decoding procedures carried out in the CDP.

Referring to FIG. 4, there is illustrated a flowchart of a $C_2$ field-decoding system in the general CDP.

Data with no pointer by an error correction and data added with pointers indicative of the presence of errors upon $C_1$ field-decoding are inputted as $C_2$ field data. First, the number of pointers is counted for the data rows in a $C_2$ direction, namely, a vertical direction, irrespective of pointers. Thereafter, a syndrome operation is carried out for checking the number of errors.

(1) No Error: Data is outputted after clearing pointers added to each data row.

(2) 1 Symbol Errors: Data is outputted after correcting one symbol error, where the error symbol is positioned within the codeword and added with a pointer. In other cases, data is outputted after copying $C_1$ pointer.

(3) 2 Symbol Errors: Data is outputted after correcting two symbol errors, where both the symbol errors are positioned within the codeword and added with pointers and the number of added pointers is not more than four. In other cases, data is outputted after copying $C_1$ field pointers or adding pointers to all of $C_2$ field data, depending on the number of pointers a determination about whether a pointer is added to each error symbol.

(4) At Least 3 Symbol Errors: Data is outputted after adding pointers to all of $C_2$ or copying $C_1$ field pointers according to a comparison of the number of pointers P1 added to $C_1$ field data with the number of symbol errors correctable by the used decoding method.

This error decoding methods corrects errors only when the errors are within the error correction capability. In other cases, an addition of pointers are achieved.

As a result, general $C_1$ field- and $C_2$ field-decoding methods can correct errors of up to two and do not utilize an erase correction. In these cases, a pointer is added to each symbol of data, after the error-correcting decoding.

The reason why the conventional methods attach importance to the error detection above the error correction is that error data can be corrected by a method such as an interpolation after the error correction, since data being recorded is not compressed data. Also, it is worth considering data that is outputted, due to the correction such as interpolation or block substitution carried out at a downstream correction stage. This is because the data being recorded is tone.

In home-use VCRs in which highly compressed data signals are processed, however, it is difficult to correct errors using the conventional error correction techniques. Since the data being processed is image data, the error correction based on pointers at the downstream correction stage after the error detection causes the picture quality to be degraded. Although there has been proposed a method for substituting the entire compression blocks with error symbols by corresponding blocks of previous frame, it causes not only a block effect, but also the degradation in picture quality at the same image data.

SUMMARY OF THE INVENTION

Therefore, an object of the invention is to provide a method for and an apparatus for correcting errors of compressed image data, capable of achieving an efficient error correction.

In accordance with one aspect, the present invention provides an apparatus for correcting errors of compressed data, comprising: third deinterleave means for receiving compressed digital data and converting burst errors of the compressed digital data into random errors; $C_1$ field decoder means for receiving compressed data from first deinterleave means and decoding data columns of the compressed data in a horizontal direction; second deinterleave means for converting burst errors of the $C_1$ field-decoded compressed data into random errors; $C_2$ field decoder means for receiving the $C_1$ field-decoded compressed data from the second deinterleave means and decoding data rows of the compressed data in a vertical direction; the first deinterleave means for converting burst errors of the $C_2$ field-decoded compressed data into random errors; and correction means for receiving the output data from the first deinterleave means, carrying out a block substitution for a correction of each pointer of the data, based on the number of pointers of the $C_1$ field-decoded compressed data, and outputting corrected data.

In accordance with another aspect, the present invention provides a method for correcting errors generated at fields of compressed data in a dual decoding manner by adding parity bits having an error correction capability for K symbols to the data fields, comprising: a third deinterleave step for receiving compressed digital data and converting burst errors of the compressed digital data into random errors, prior to a $C_1$ field-decoding step; the $C_1$ field-decoding step for receiving compressed data outputted after a first deinterleave step and decoding data columns of the compressed data in a horizontal direction; a second deinterleave step for converting burst errors of the $C_1$ field-decoded compressed data into random errors; a $C_2$ field-decoding step for receiving the $C_1$ field-decoded compressed data outputted after the second deinterleave step and decoding data rows of the compressed data in a vertical direction; the first deinterleave step for converting burst errors of the $C_2$ field-decoded compressed data into random errors; and a correcting step for receiving the data outputted after the first deinterleave step, carrying out a block substitution for a correction of each pointer of the data, based on the number of pointers of the $C_1$ field-decoded compressed data, and outputting corrected data.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 5:
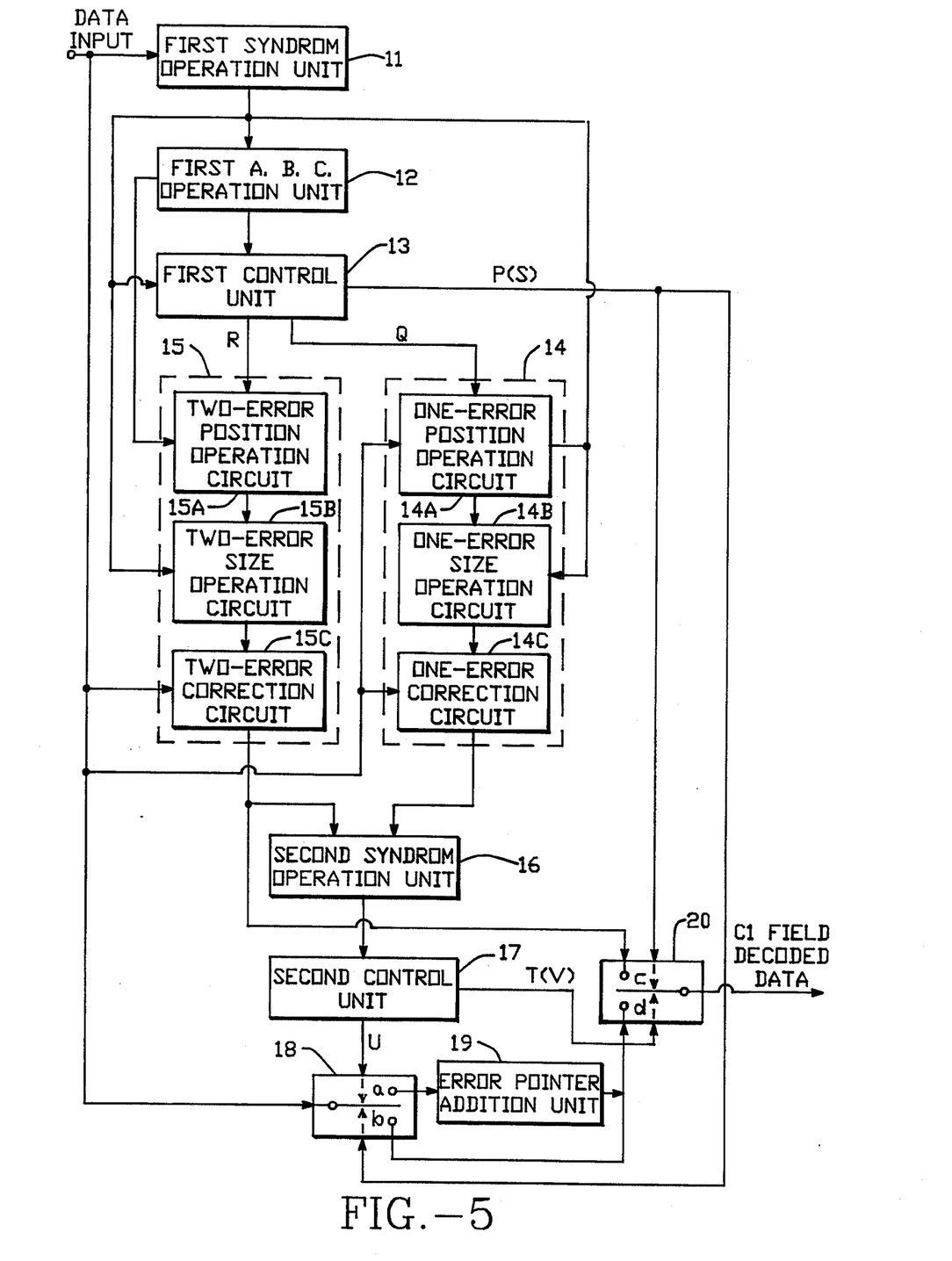
FIG. 5 is a block diagram of a $C_1$ field-decoding system to which a method of correcting errors of compressed data according to the present invention is applied.

FIG. 5 is a block diagram of a $C_1$ field-decoding system using a method for correcting errors of compressed data according to the present invention.

As shown in FIG. 5, the decoding system comprises a first syndrome operation unit 11 for deriving syndromes $S_0$ to $S_3$ from inputted data, a first A, B and C operation unit 12 for deriving the values of A $(=S_1^2+S_0S_2)$, B $(=S_0S_1+S_1S_2)$ and C $(=S_2^2+S_1S_3)$ from the syndromes $S_0$ to $S_3$, a first control unit 13 for receiving the syndromes $S_0$ to $S_3$ from the first syndrome operation unit 11 and the values of A, B and C from the first A, B and C operation unit 12, deriving the number of symbol errors based on each received values and outputting control signals P, Q, R and S based on respective of the derived number of symbol errors, and a one-error correcting unit 14 for receiving the syndromes $S_0$ and $S_3$ from the first syndrome operation unit 11, in response to inputting of the control signal Q from the first control unit 13, deriving the position and size of the one error and correcting the one error. The decoding system also comprises a two-error correcting unit 15 for receiving the syndromes $S_0$ to $S_3$ from the first syndrome operation unit 11, in response to inputting of the control signal R from the first control unit 13, deriving the position and size of each of the two errors and correcting the two errors, a second syndrome operation unit 16 for receiving corrected data from the one error and two-error correcting units 14 and 15 and operating syndromes $S_0'$ to $S_3'$ from the received data, and a second control unit 17 for outputting switching control signals U and V when even one of the syndromes outputted from the second syndrome operation unit 15 is not zero and outputting a switching control signal T when all of the syndromes outputted from the second syndrome operation unit 16 is zero. The decoding system also comprises a switching unit 18 for sending the data inputted from the data input stage to an error pointer addition unit 19 when the control signals S and U are inputted and bypassing the data in other cases, and another switching unit 20 for outputting the corrected data without an addition of error pointer when a switching control signal T from the second control signal unit 17 is inputted and the corrected data with an addition of error pointer when switching control signals S and V is inputted.

Figure 7:
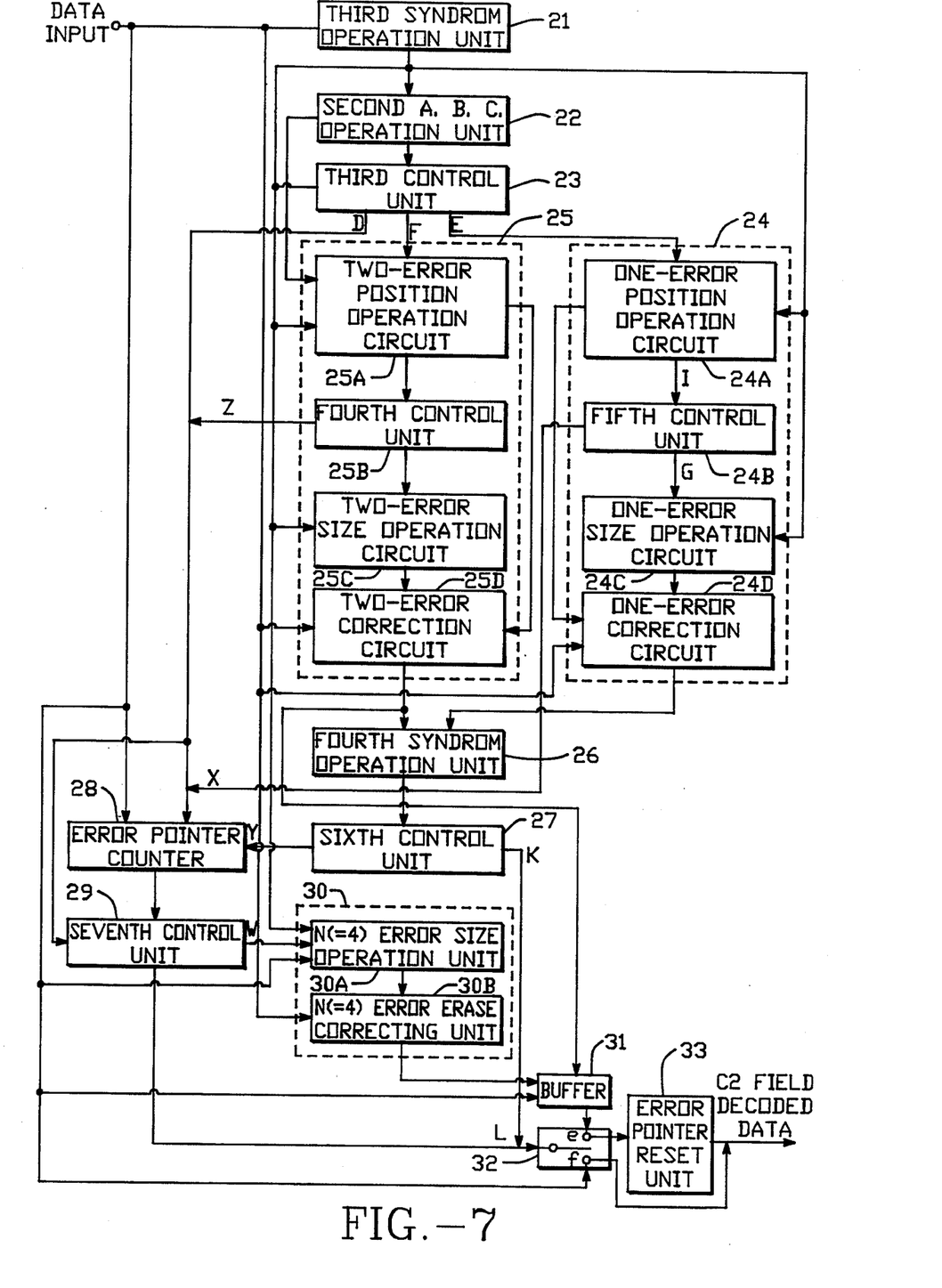
FIG. 7 is a block diagram of a $C_2$ field-decoding system to which a method of correcting errors of compressed data according to the present invention is applied.

FIG. 7 is a block diagram of a $C_2$ field-decoding system to which a method for correcting errors of compressed data according to the present invention.

As shown in FIG. 7, the decoding system comprises a third syndrome operation unit 21 for deriving syndromes $S_0$ to $S_3$ from $C_1$ field-decoded input data, a third A, B and C operation unit 22 for deriving the values of A $(=S_1^2+S_0S_2)$, B $(=S_0S_3+S_1S_2)$ and C $(=S_2^2+S_1S_3)$ from the syndromes $S_0$ to $S_3$, a third control unit 23 for receiving the output from the third A, B and C operation unit 22 and outputting control signals D, E and F based on respective of the outputs, and a one-error correcting unit 24 for operating the position of the one error, in response to inputting of the control signal E from the third control unit 23 and outputting a control signal X or correcting the size of the one error as well as the one error itself, based on the result of a comparison of a value derived from the operated one-error position with a codeword inputted from the data input stage. The decoding system also comprises a two-error correcting unit 25 for operating the positions of two errors, in response to inputting of the control signal F from the third control unit 23 and outputting a control signal Z or correcting respective sizes of the two errors as well as the two errors themselves, based on the result of a comparison of a value derived from the operated two-error positions with a codeword inputted from the data input stage, a fourth syndrome operation unit 26 for receiving corrected data from the one-error and two-error correcting units 24 and 25 and operating syndromes $S_0'$ to $S_3'$ from the received data, and a sixth control unit 27 for outputting a control signal Y when even one of the syndromes outputted from the fourth syndrome operation unit 26 is not zero and outputting a switching control signal K when all of the syndromes outputted from the fourth syndrome operation unit 26 is zero. The decoding system also comprises an error pointer counter 28 for receiving data rows, in response to inputting of the control signals D, X, Y, Z and calculating the number of added error pointers, a seventh control unit 29 for outputting control signals L and W, based on the number of error pointers calculated by the error pointer counter 28, a data erase correction unit 30 for receiving the syndromes from the third syndrome operation unit 21 and the data from the data input stage, in response to inputting of the control signal W from the seventh control unit 29, and a switching unit 32 for outputting the erase-corrected data from the data erase correction unit 30 or outputting the erase-corrected-data with resetted pointers, in response to inputting of the control signal K or L.

The operation of the decoding systems with the abovementioned arrangements according to the present invention will be now described in detail.

First, the $C_1$ field-decoding operation will be described, in conjunction with FIGS. 5 and 6. The first syndrome operation unit 11 receives data of, for example, 32 symbols horizontally arranged from the data input stage and carries out a first syndrome operation for operating the syndromes $S_0$, $S_1$, $S_2$ and $S_3$ from the received data. The first A, B and C operation unit 12 receives the syndromes $S_0$, $S_1$, $S_2$ and $S_3$ from the first syndrome operation unit 11 and operates the values of A ($=S_1^2+S_0S_2$), B ($=S_0S_3+S_1S_2$) and C ($=S_2^2+S_1S_3$) from the syndromes $S_0$ to $S_3$. The operated values are inputted at the first control unit 13.

In addition to the values of A, B and C from the first A, B and C operation unit 12, the first control unit 13 receives the syndromes $S_0$ to $S_3$ from the first syndrome operation unit 11. Base on the received the values of A, B and C and the syndromes $S_0$ to $S_3$, the first control unit 13 outputs various control signals.

First, where $S_0=0$, $S_3=0$ and $A=B=C=0$, that is, when no error is presented, the first control unit 13 shown in FIG. 5 outputs the control signal P at the first and second switching unit 18 and 20 so that movable terminals of the first and second switching unit 18 and 20 are connected to the corresponding terminals b and d, respectively. In this case, the received data is outputted without an addition of error pointers.

Figure 6:
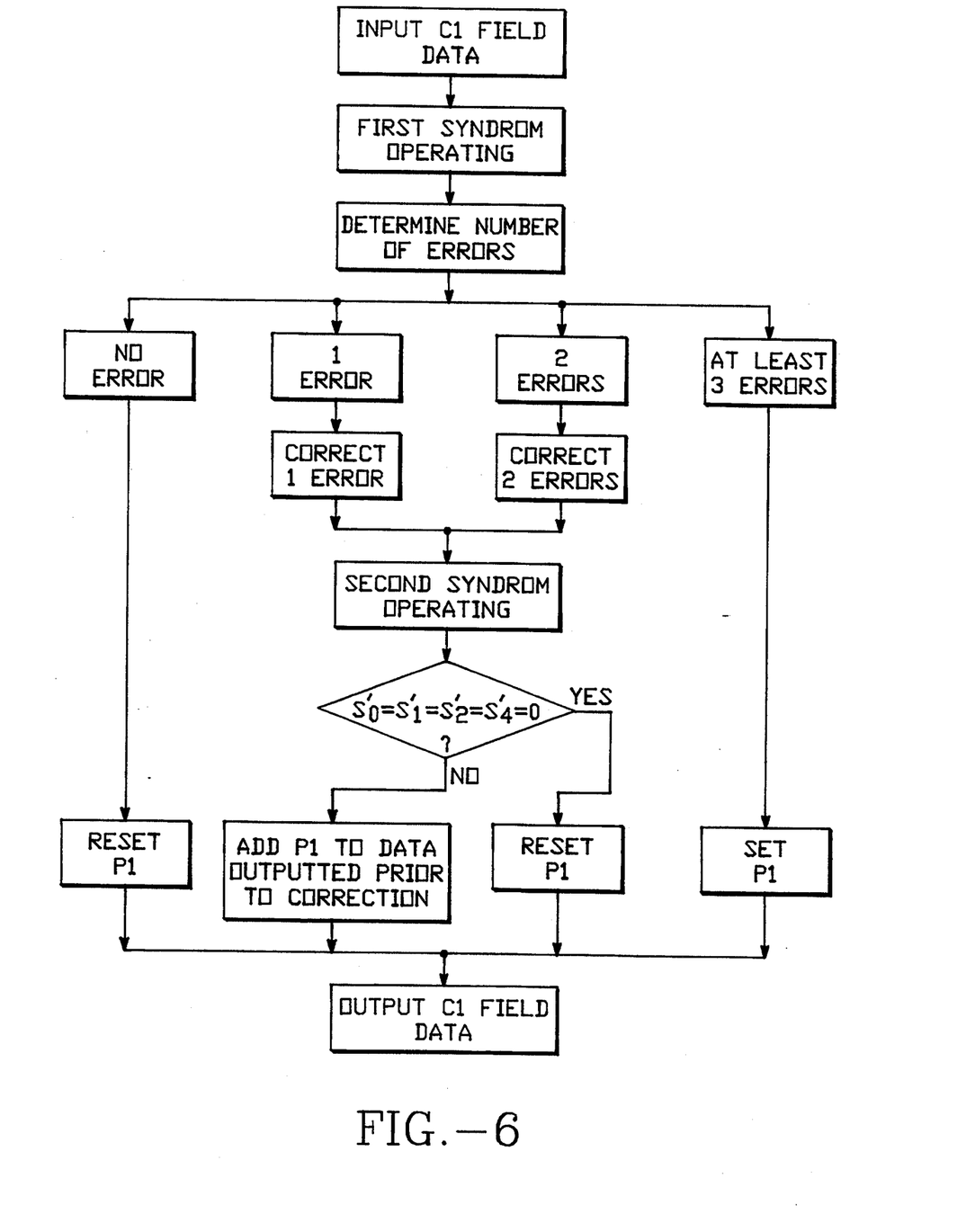
FIG. 6 is a flowchart of signals in $C_1$ field-decoding procedures carried out in the system shown in FIG. 5.

Second, where $S_0=0$, $S_3=0$ and $A=B=C=0$, that is, when one symbol error is presented, a second syndrome operation is carried out for the data outputted after the one symbol error correction, as shown in FIG. 6. Then, a determination is made about whether the error correction has been correctly achieved, that is, all syndromes are zero. When all syndromes are zero, the corrected data is outputted without an addition of error pointers. When even one of syndromes is not zero, an erroneous correction has been made. For example, 4 symbol errors has been erroneously detected as 1 symbol error. Accordingly, data outputting is carried out under the condition of adding pointers to the data outputted prior to the correction, so as to prevent an increase in errors due to the erroneous correction.

This procedure will be described in detail, in conjunction with FIG. 5. As the first control unit 13 outputs the control signal Q at the one-error correcting unit 14 which comprises a one-error position operation circuit 14A, a one-error size operation circuit 14B and a one-error correcting circuit 14C, the one-error position operation circuit 14A and the one-error size operation circuit 14B receive the syndromes $S_0$ and $S_1$ from the first syndrome operation unit 11 and operate the position and size of the one error. On the other hand, the one-error correcting circuit 14C receives the operated one-error position and size from the one-error position operation circuit 14A and the one-error size operation circuit 14B and corrects the one error, based on the received one-error position and size.

Third, where $A=0$, $B=0$ and $C=0$, that is, when two symbol errors are presented, a second syndrome operation is carried out for the data outputted after the two symbol error correction, as shown in FIG. 6, so as to prevent an erroneous correction for at least three symbols. Then, a determination is made about whether the error correction has been correctly achieved, that is, all syndromes are zero. When all syndromes are zero, the corrected data is outputted without an addition of error pointers. When even one of syndromes is not zero, an erroneous correction has been made. For example, 4 symbol errors has been erroneously detected as 1 symbol error. Accordingly, data outputting is carried out under the condition of adding pointers to the data outputted prior to the correction, so as to prevent an increase in errors due to the erroneous correction.

Herein, both a case when only two symbol errors have occurred and a case when at least three symbol errors have occurred are determined as the case with the two symbol errors. This is the limitations of the error correction capability of error correcting codes added with 4 symbol parity bits.

The correction for two symbol errors is carried out as follows. As shown in FIG. 5, the control signal R from the first control unit 13 is inputted at the two-error correcting unit 15 which comprises a two-error position operation circuit 15A, a two-error size operation circuit 15B and a two-error correcting circuit 15C, the two-error position operation circuit 15A receives the value of A from the first A, B and C operation unit 12 and operates respective positions of the two errors. The two-error size operation circuit 15B receives the syndromes $S_1$ and $S_2$ from the first syndrome operation unit 11 and the operated position data from the two-error position operation circuit 15A and operates respective sizes of the two errors. On the other hand, the two-error correcting circuit 15C receives the data from the data input stage and the operated two-error position and size from the two-error position operation circuit 15A and the two-error size operation circuit 15B and corrects the two error.

Fourth, in other cases, that is, when at least three symbol errors beyond the data correction capability are presented, data is outputted after adding pointers to all data columns, as shown in FIG. 6. That is, the first control unit 13 outputs the control signal S at the switching units 18 and 20. The movable terminals of the first and second switching unit 18 and 20 are connected to the corresponding terminals a and d, respectively, so that the error pointer addition unit 19 adds error pointers to the received data.

The data corrected by the above-mentioned second and third procedures is inputted in the second syndrome operation unit 16. The second syndrome operation unit 16 operates the syndromes $S_0'$ to $S_3'$ of the received data and outputs the operation results at the second control unit 17. The second control unit 17 outputs the control signal T at the switching unit 20, when all the received syndromes are zero. In response to inputting the control signal T, the movable terminal of the switching unit 20 is switched to the fixed terminal, so that the corrected data is outputted without an addition of error pointers.

On the other hand, the second control unit 17 outputs the control signals U and V at the switching unit 18 and 20, when even one of the received syndromes is zero. In response to inputting of the control signals U and V, the movable terminals of the switching unit 18 and 20 are connected to the fixed terminals a and d, respectively. Accordingly, the data outputted prior to the correction is added with error pointers.

The $C_1$ field-decoding can correct errors of up to two corresponding to the maximum correction capability for the four symbol parity bits, determines whether the correction has been correctly made, through the second syndrome operation, and adds pointers, based on the result of the determination, so as to prevent an erroneous correction.

Figure 8:
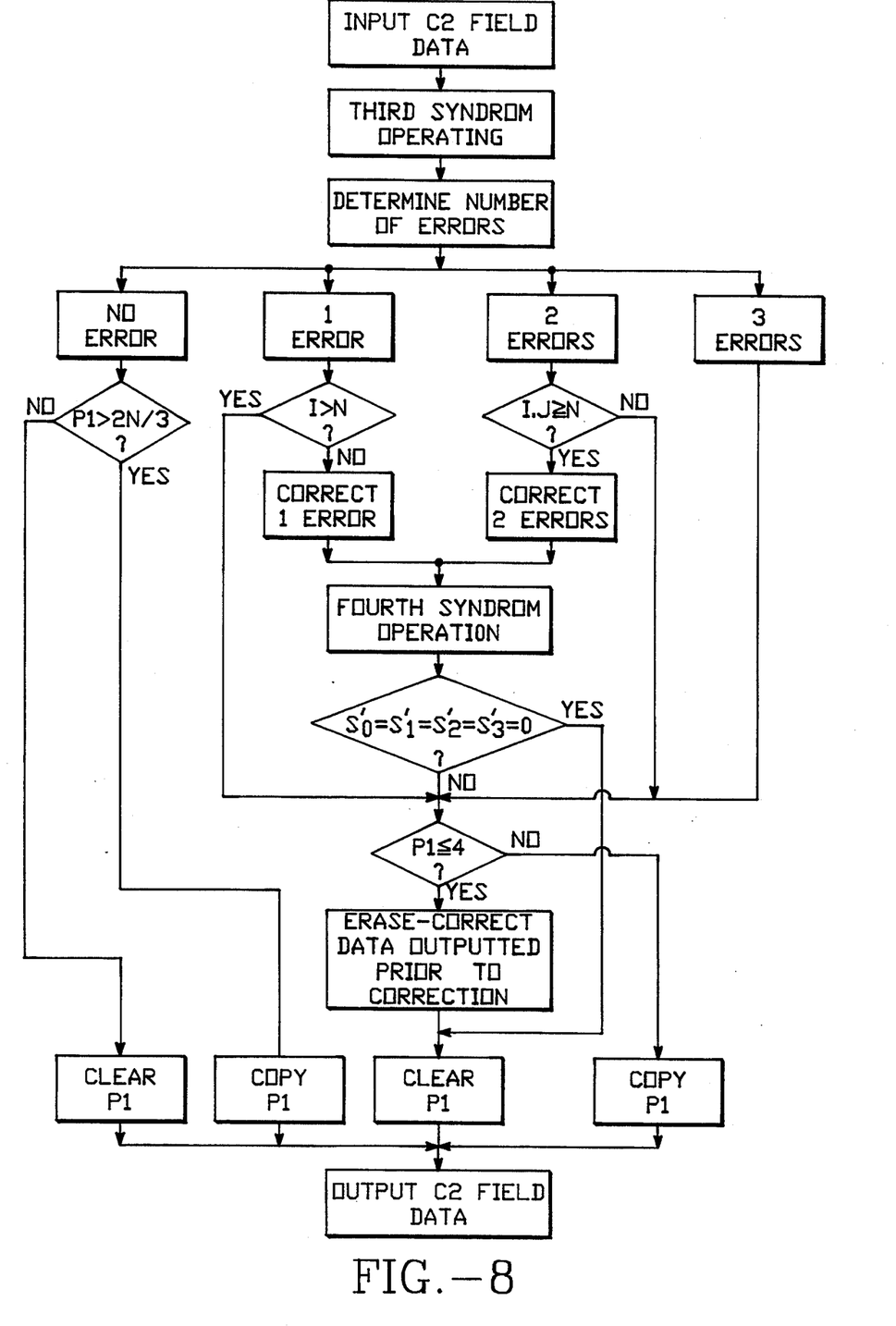
FIG. 8 is a flowchart of signals in $C_2$ field-decoding procedures carried out in the system shown in FIG. 7.

On the other hand, FIGS. 7 and 8 illustrate the $C_2$ field-decoding procedures. The third syndrome operation unit 21 receives $C_1$ field-decoded data of, for example, 28 symbols vertically arranged from the data input stage and carries out a third syndrome operation for operating the syndromes $S_0$, $S_1$, $S_2$ and $S_3$ from the received data. The second A, B and C operation unit 22 receives the syndromes $S_0$, $S_1$, $S_2$ and $S_3$ from the third syndrome operation unit 11 and operates the values of A ($=S_1^2+S_0S_2$), B ($=S_0S_1+S_1S_2$) and C ($=S_2^2+S_1S_3$) from the syndromes $S_0$ to $S_3$. The operated values are inputted at the third control unit 23.

In addition to the values of A, B and C from the second A, B and C operation unit 22, the third control unit 23 receives the syndromes $S_0$ to $S_3$ from the third syndrome operation unit 21. Based on the received the values of A, B and C and the syndromes $S_0$ to $S_3$, the third control unit 23 outputs control signals D, E and F.

First, where $S_0=0$, $S_3=0$ and A=B=C=0, that is, when no error is presented, the number of pointers added to each received data row is countered. When no error is presented, that is, when a determination has been made about that the counted number of pointers has not been more than ⅔ of the number N of symbols, data is outputted without an addition of pointers. When the counted number of pointers has been more than ⅔ of the number N of symbols, data is outputted after copying the pointers added upon the $C_1$ field-decoding, so as to prevent an occurrence of an erroneous correction, for example, an erroneous detection of 5 symbol errors as a no error.

Thereafter, the third control unit 23 outputs a control signal D' at both the error pointer counter 28 and the seventh control unit 29, as shown in FIG. 7. The error pointer counter 28 receives data rows vertically arranged from the data input stage and counts the added error pointers. The counted number of error pointers is outputted at the seventh control unit 29.

Referring to FIG. 8, there is illustrated a decoding procedure when one symbol error or two symbol errors are presented. When a determination has been made about that both the values I and J indicative of the positions of errors has been within the $C_2$ field codeword N, the errors are corrected and a fourth syndrome operation is carried out for the corrected data. When all syndromes operated by the fourth syndrome operation are zero, a determination is made about that the correction has been correctly made. In this case, the corrected data is outputted without an addition of pointers.

Where the positions I and J of errors is beyond the $C_2$ field codeword N or even one of the syndromes operated by the fourth syndrome operation is not zero, a determination is made about that the correction has been erroneously made. In this case, the erase correction is carried out. Now, the erase correction will be described.

The number of pointers added to the $C_1$ field-decoding data in a $C_2$ field direction is counted. When the number of pointers is not more than four corresponding to the maximum correction capability, the erase correction is carried out using the data outputted prior to the data correction. Thereafter, data is outputted without an addition of pointers. When the number of pointers is more than four, data is outputted after copying the pointers added upon the $C_1$ field-decoding.

Second, where $S_0=0$, $S_3=0$ and A=B=C=0, that is, when one symbol error is presented, the third control unit 23 outputs the control signal E at the one-error correcting unit 24 which comprises a one-error position operation circuit 24A, a fifth control unit 24B, a one-error size operation circuit 24C and a one-error correcting circuit 24D, as shown in FIG. 7. In response to inputting of the control signal E, the one-error position operation circuit 24A receives the syndromes $S_0$ and $S_1$ from the third syndrome operation unit 21 and operate the position of the one error. Then, the one-error position operation circuit 24A outputs the value I indicative of the operated position of the one error at the fifth control unit 24B. The fifth control unit 24B determines whether the received value I is more than the size N, for example, 28. When a determination is made about that the value I has been more than the size N, the fifth control unit 24B outputs a control signal G at the one-error size operation circuit 24C so that the operation of the one-error size operation circuit 24C is stopped. At the same time, the control signal D from the third control unit 23 is sent to the error pointer counter unit 28. In response to inputting of the control signal D, the error pointer counter unit 28 carries out its counting in the same manner as the above-mentioned first procedure.

The fifth control unit 24B does not output any control signal, when the received value I is not more than N. In this case, the one-error size operation circuit 24C receives the syndromes $S_0$ and $S_1$ from the third syndrome operation unit 21 and operates the size of the one error. The one-error correcting circuit 24D then receives the operated position I and size and corrects one error, based on the operated position I and size.

Third, where A=0, B=0 and C=0, that is, when two symbol errors are presented, the third control unit 23 sends the control signal F to the two-error correcting unit 25 which comprises a two-error position operation circuit 25A, a fourth control unit 25B, a two-error size operation circuit 25C and a two-error correcting circuit 25D. In response to inputting of the control signal F, the two-error position operation circuit 25A receives the syndromes $S_0$, $S_1$, $S_2$ and $S_3$ from the third syndrome operation unit 21 and operates the positions of the two errors. Then, the two-error position operation circuit 25A outputs the values I and J indicative of the operated position of the two errors at the fourth control unit 25B. The fourth control unit 25B determines whether even one of the received values I and J is more than the maximum size N (for example, 28) of the codeword received from the data input stage. When a determination is made about that even one of the values I and J has been more than the size N, the fourth control unit 25B outputs a control signal H at the two-error size operation circuit 25C so that the operation of the two-error size operation circuit 25C is stopped. At the same time, the control signal D from the third control unit 23 is sent to the error pointer counter unit 28. In response to inputting of the control signal D, the error pointer counter unit 28 carries out its counting in the same manner as the above-mentioned first procedure.

The fourth control unit 25B does not output any control signal, when both the received values I and J are not more than N. In this case, the two-error size operation circuit 25C receives the syndromes $S_1$ and $S_2$ from the third syndrome operation unit 21, along with the operated position values I and J from the two-error position operation unit 25A. On the other hand, the two-error correcting circuit 25D receives the operated position values I and J along with the data from the data input stage and the operated size value from the two-error size operation circuit 25C. Based on the position values I and J, the data and the size value, the two-error correcting circuit 25D corrects two errors.

Fourth, in other cases, that is, when at least three symbol errors beyond the data erase correction capability are presented, the data from the data input stage is directly sent to the data erase correction unit 30 which comprises a $\eta$ ($\eta=4$) error size operation circuit 30A and a $\eta$ ($\eta=4$) erase correction circuit 30B. The data erase correction unit 30 outputs data, based on the received data. That is, the data erase correction unit 30 sends the control signal D to the error pointer counter 28. Subsequent procedure is carried out in the same manner as the first procedure.

On the other hand, the corrected data according to the second procedure and the corrected data according to the third procedure are sent to the fourth syndrome operation unit 26. Based on the received data, the fourth syndrome operation unit 26 operates syndromes $S_0'$, $S_1'$, $S_2'$ and $S_3'$ which are, in turn, sent to the sixth control unit 27.

The sixth control unit 27 checks the received syndromes $S_0'$, $S_1'$, $S_2'$ and $S_3'$. When all the syndromes $S_0'$, $S_1'$, $S_2'$ and $S_3'$ are zero, the sixth control unit 27 outputs the control signal K which is, in turn, sent to the switching unit 32 via a buffer 31. In response to inputting of the control signal K, the movable terminal of the switching unit 32 is connected to the fixed terminal e, so as to send the corrected data to the error pointer reset unit 33. Accordingly, the pointers added to the corrected data upon the $C_1$ field decoding are resetted in the error pointer reset unit 33. When even one of the syndromes $S_0'$, $S_1'$, $S_2'$ and $S_3'$ are zero, the sixth control unit 27 sends the control signal to the error pointer counter 28. Subsequent procedure is carried out in the same manner as the first procedure.

On the other hand, when the error pointer counter 28 outputs the counted number of error pointers at the seventh control unit 29, the seventh control unit 29 operates, based on the received number of error pointers. The operation of the seventh control unit 29 will be now described.

First, where a determination is made by the third control unit 23 about that no error has been presented, that is, when the number of error pointers has been more than $\frac{2}{3}$ of the number N of symbols and the control signal D' has been outputted from the third control unit 23 to the seventh control unit 29, the seventh control unit 29 outputs the control signal L at the switching unit 32. Based on the control signal L, the movable terminal of the switching unit 32 is connected to the fixed terminal f. Accordingly, the data from the data input stage is directly outputted as a $C_2$ field-decoded data output.

Second, when the number of error pointers has not been more than $\frac{2}{3}$ of the number N of symbols and the control signal D' has been outputted from the third control unit 23 to the seventh control unit 29, the seventh control unit 29 outputs the control signal M at the switching unit 32. Based on the control signal M, the movable terminal of the switching unit 32 is connected to the fixed terminal e. Accordingly, the data from the data input stage is outputted after its error pointers added thereto upon the $C_1$ field-decoding is resetted by the error pointer reset unit 33.

Third, when the number of error pointers has not been more than 4 and the control signal D' has not been outputted from the third control unit 23 to the seventh control unit 29, the seventh control unit 29 outputs the control signal W at the data erase correction unit 30 and the control signal M at the switching unit 32.

In response to inputting of the control signal W, the $\eta$ error size operation circuit 30A of the data erase correction unit 30 operates the sizes of $\eta$ errors, based on the syndromes received from the third syndrome operation unit 21 and the data received from the data input stage. Also, the $\eta$ erase correction circuit 30B erase-corrects the $\eta$ errors, based on the sizes of $\eta$ errors and the data received from the data input stage. The erase-corrected data is inputted at the buffer 31 and then the switching unit 23 in which the movable terminal of the switching unit 32 is maintained to be connected to the fixed terminal e, by virtue of the control signal M. Accordingly, the data from the data input stage is outputted after its error pointers added thereto upon the $C_1$ field-decoding is resetted by the error pointer reset unit 33.

Fourth, when the number of error pointers has been more than 4 and the control signal D' has not been outputted from the third control unit 23 to the seventh control unit 29, the procedure is carried out in the same manner as the first procedure.

In the above-mentioned four procedures, inputting of data at the switching unit 32 via the buffer is carried out in the order of the data from the data input stage, the data from the one-error correcting unit 24 or the two-error correcting unit 25, and the data from the $\eta$ erase correction circuit 30B. In the buffer 31, newly inputted data is substituted for the previous data.

The characteristic of the $C_2$ field-decoding mentioned above is that the probability of an erroneous correction is minimized by checking the number of $C_1$ field pointers even when no error has occurred. When one symbol error or two symbol errors have occurred, a checking is made about whether the data have been erroneously corrected. This checking is achieved by the second syndrome operation. When an erroneous correction has occurred, a data erase correction is carried out using the data outputted prior to the correction.

When at least three symbol errors have occurred, the data erase correction is also performed. Accordingly, there is an improvement in error correction capability.

As apparent from the above description, the present invention uses both the error correction capability and the error detection capability of error correction codes for correcting errors of data, thereby preventing errors generated at compressed sdata from being propagated to original image data. In accordance with the present invention, the probability of an erroneous correction is minimized by checking, through the second syndrome operation, about whether the data have been erroneously corrected. The conventional methods achieve an error correction by adding many pointers and thus many block substitutions at the downstream correction stage, because the data compressed by the conversion coding or the variable length-coding is difficult to be corrected or interpolated by peripheral data. However, such conventional methods have a disadvantage of a degradation in picture quality. The present invention uses an addition of relatively few pointers and thus minimizes a degradation in picture quality.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for correcting errors of compressed data, comprising:
   third deinterleave means for receiving compressed digital data and converting burst errors of the compressed digital data into random errors;
   $C_1$ field decoder means for receiving compressed-data from first deinterleave means and decoding data columns of the compressed data in a horizontal direction;
   second deinterleave means for converting burst errors of the $C_1$ field-decoded compressed data into random errors;
   $C_2$ field decoder means for receiving the $C_1$ field-decoded compressed data from the second deinterleave means and decoding data rows of the compressed data in a vertical direction;
   the first deinterleave means for converting burst errors of the $C_2$ field-decoded compressed data into random errors; and
   correction means for receiving the output data from the first deinterleave means, carrying out a block substitution for a correction of each pointer of the data, based on the number of pointers of the $C_1$ field-decoded compressed data, and outputting corrected data.

2. An apparatus in accordance with claim 1, wherein the $C_1$ field decoder means comprises:
   a first syndrome operation unit for receiving a predetermined number of data arranged in a horizontal direction from a data input stage and operating syndromes ($S_0$ to $S_3$) from the received data;
   a first A, B and C operation unit for operating the values of A ($A=S_1^2+S_0S_2$), B ($B=S_0S_1+S_1S_2$) and C ($C=S_2^2+S_1S_3$) based on the syndromes ($S_0$ to $S_3$);
   a first control unit for receiving the syndromes ($S_0$ to $S_3$) from the first syndrome operation unit and the values of A, B and C from the first A, B and C operation unit, deriving the number of symbol errors based on each received values and outputting control signals (P, Q, R and S) based on respective of the derived number of symbol errors;
   a one-error correcting unit for receiving the syndromes ($S_0$ and $S_1$) from the first syndrome operation unit, in response to inputting of the control signal (Q) from the first control unit, deriving the position and size of the one error and correcting the one error;
   a two-error correcting unit for receiving the syndromes ($S_0$ to $S_3$) from the first syndrome operation unit, in response to inputting of the control signal (R) from the first control unit, deriving the position and size of each of the two errors and correcting the two errors;
   a second syndrome operation unit for receiving the corrected data from the one-error and two-error correcting units and operating syndromes ($S_0'$ to $S_3'$) based on the received data, so as to determine about the presence of errors in the corrected data;
   a second control unit for outputting switching control signals (U and V) when even one of the syndromes ($S_0'$ to $S_3'$) outputted from the second syndrome operation unit is not zero and outputting a switching control signal (T) when all of the syndromes ($S_0'$ to $S_3'$) is zero;
   a switching unit for sending the data inputted from the data input stage to an error pointer addition unit when the control signals (S and U) from the first and second control units are inputted and bypassing the data without an addition of pointers when the control signal (P) is inputted;
   the error pointer addition unit for adding pointers to the data received from the switching unit; and
   another switching unit for outputting the corrected data without an addition of pointers when the control signals (P and T) from the first and second control units are inputted and outputting the corrected data with an addition of error pointers when the control signals (S and V) from the first and second control units are inputted.

3. An apparatus in accordance with claim 2, wherein the one-error correcting unit comprises:
   a one-error position operation circuit for receiving the syndrome ($S_0$ and $S_1$) from the first syndrome operation unit, in response to inputting of the control signal (Q) from the first control unit and operating a position of and a size of the one error, based on the received syndrome ($S_0$ and $S_1$); and
   a one-error correcting circuit for receiving the data from the data input stage and the operated one-error position and size from the one-error position operation circuit and correcting the one error, based on the received one-error position and size.

4. An apparatus in accordance with claim 2, wherein the two-error correcting unit comprises:
   a two-error position operation circuit for receiving the value of A from the first A, B and C operation unit, in response to inputting of the control signal (R) from the first control unit and operating respective positions of the two errors;

a two-error size operation circuit receives the syndromes ($S_1$ and $S_2$) from the first syndrome operation unit and the operated positions from the two-error position operation circuit and operating respective sizes of the two errors; and a two-error correcting circuit for receiving the data from the data input stage and the operated positions and sizes of the two errors from the two-error position operation circuit and the two-error size operation circuit and correcting the two errors.

5. An apparatus in accordance with claim 1, wherein the $C_2$ field decoder means comprises:

a third syndrome operation unit for operating syndromes ($S_0$ to $S_3$) from $C_1$ field-decoded input data from a data input stage connected to the $C_1$ field decoder means;

a third A, B and C operation unit for receiving the syndrome ($S_0$ to $S_3$) from the third syndrome operation unit and operating the values of A ($A = S_1^2 + S_0 S_2$), B ($B = S_0 S_3 + S_1 S_2$) and C ($C = S_2^2 + S_1 S_3$) from the received syndromes ($S_0$ to $S_3$);

a third control unit for receiving the values of A, B and C from the third A, B and C operation unit and outputting control signals (D, E and F) based on respective of the values;

a one-error correcting unit for receiving the syndromes ($S_0$ and $S_1$) from the third syndrome operation unit, in response to inputting of the control signal (E) from the third control unit, operating the position of the one error, comparing a value (I) indicative of the operated one-error position with a size of a codeword inputted from the data input stage, and outputting a control signal (X) or correcting the size of the one error as well as the one error itself, based on the result of the comparison;

a two-error correcting unit for receiving the syndromes ($S_0$ and $S_1$) from the third syndrome operation unit, in responses to inputting of the control signal (F) from the third control unit, operating the positions of two errors, comparing respective values (I and J) indicative of the operated two-error positions with a size of a codeword inputted from the data input stage, and outputting a control signal (Z) or correcting respective sizes of the two errors as well as the two errors themselves, based on the result of the comparison;

a fourth syndrome operation unit for receiving corrected data from both the one-error correcting unit and the two-error correcting unit and operating syndromes ($S_0'$ to $S_3'$), based on the received data;

a sixth control unit for outputting a control signal (Y) when even one of the syndromes ($S_0'$ to $S_3'$) outputted from the fourth syndrome operation unit is not zero and outputting a control signal (K) when all of the syndromes ($S_0'$ to $S_3'$) is zero;

an error pointer counter for receiving each of vertically arranged data rows of the data from the data input stage, in response to inputting of the control signals (D, X, Y and Z) and calculating the number of added error pointers;

a seventh control unit for outputting control signals (L and W), based on the number of error pointers calculated by the error pointer counter;

a data erase correction unit for receiving the syndromes ($S_0$ to $S_3$) from the third syndrome operation unit and the data from the data input stage, in response to inputting of the control signal (W) from the seventh control unit and carrying out a data erase correction; and a switching unit for outputting the erase-corrected data from the data erase correction unit or outputting the erase-corrected data with resetted pointere, in response to inputting of one of the control signals (K and L).

6. An apparatus in accordance with claim 3, wherein the first error correction unit 24 comprises:

a one-error position operation circuit for receiving the syndromes ($S_0$ and $S_1$) from the third syndrome operation unit, in response to inputting of the control signal (E) from the third control unit and operating the position of the one error;

a fifth control unit for receiving a value (I) indicative of the operated position of the one error from the one-error position operation circuit, comparing the value (I) with the size of the codeword inputted from the data input stage, and outputting a control signal (G) when the value (I) is more than the size;

a one-error size operation circuit for receiving the syndromes ($S_0$ and $S_1$) from the third syndrome operation unit, in response to inputting of the control signal (G) from the fifth control unit and operating the size of the one error; and a one-error correcting circuit for receiving the data from the data input stage, the value (I) from the one-error position operation circuit and the operated size from the one-error size operation circuit and correcting the one error.

7. An apparatus in accordance with claim 3, wherein the two-error correcting unit comprises:

a two-error position operation circuit for receiving the syndromes ($S_0$ to $S_3$) from the third syndrome operation unit, in response to inputting of the control signal (F) from the third control unit and operating the positions of the two errors;

a fourth control unit for receiving values (I and J) indicative of the operated positions of the two errors from the two-error position operation circuit, comparing the values (I and J) with the size of the codeword inputted from the data input stage, and outputting a control signal (H) when even one of the values (I and J) is more than the size;

a two-error size operation circuit for receiving the syndromes ($S_0$ and $S_1$) from the third syndrome operation unit and the values (I and J) from the two-error position operation circuit, in response to inputting of the control signal (H) from the fourth control unit and operating the size of the two errors; and a two-error correcting circuit for receiving the data from the data input stage, the values (I and J) from the two-error position operation circuit and the operated sizes from the two-error size operation circuit and correcting the two errors.

8. A method for correcting errors generated at fields of compressed data in a dual decoding manner by adding parity bits having an error correction capability for K symbols to the data fields, comprising:

a third deinterleave step for receiving compressed digital data and converting burst errors of the compressed digital data into random errors, prior to a $C_1$ field-decoding step;

the $C_1$ field-decoding step for receiving compressed data outputted after a first deinterleave step and decoding data columns of the compressed data in a horizontal direction;

a second deinterleave step for converting burst errors of the $C_1$ field-decoded compressed data into random errors;

a $C_2$ field-decoding step for receiving the $C_1$ field-decoded compressed data outputted after the second deinterleave step and decoding data rows of the compressed data in a vertical direction;

the first deinterleave step for converting burst errors of the $C_2$ field-decoded compressed data into random errors; and a correcting step for receiving the data outputted after the first deinterleave step, carrying out a block substitution for a correction of each pointer of the data, based on the number of pointers of the $C_1$ field-decoded compressed data, and outputting corrected data.

9. A method in accordance with claim 8, wherein the $C_1$ field-decoding step comprises the steps of:

(a) receiving $C_1$ field data from a $C_1$ field data input stage, carrying out a first syndrome operation for the $C_1$ field data and determining the number of errors, based on the result of the first syndrome operation;

(b) resetting the $C_1$ field pointers (P1) when no error has been presented and setting the pointers (P1) when the number of errors has not been $K+1$;

(c) correcting the errors when the number of errors have not been less than one and more than K, carrying out a second syndrome operation and determining the presence of errors in the corrected data; and (d) adding the pointers (P1) to the corrected data when a determination has been made at the step (c) about that errors have been presented in the corrected data and resetting the pointers (P1) when a determination has been made at the step (c) about that no error has been presented in the corrected data.

10. A method in accordance with claim 8, wherein the $C_2$ field-decoding step comprises:

(a) receiving $C_2$ field data from a $C_2$ field data input stage, carrying out a third syndrome operation for the $C_2$ field data and determining the number of errors, based on the result of the third syndrome operation;

(b) copying the $C_1$ field pointers (P1) added at the $C_1$ field-decoding step when no error has been presented and the number of pointers (P1) has been less than $\frac{2}{3}$ of a predetermined critical value (N) and clearing the pointers (P1) in other cases;

(c) correcting errors when a determination has been made at the step (a) about that the number of errors has not been less than one and more than K and has been within the total codeword size (N);

(d) carrying out a fourth syndrome operation for the data corrected at the step (c), determining about the presence of errors in the corrected data, and clearing pointers (P1);

(e) erase-correcting the data outputted prior to the correction and clearing the pointers (P1) when the number of pointers (P1) added to the data has not been more than the number of parity bits (2K) and copying the pointers (P1) when the number of pointers (P1) added to the data has been more than the number of parity bits (2K); and (f) carrying out the step (e) when the number of errors has not been less than $K+1$ or when the number of errors has been beyond the total codeword size (N).

* * * * *